United States Patent
Angelopoulos et al.

(10) Patent No.: US 7,485,573 B2
(45) Date of Patent: Feb. 3, 2009

(54) PROCESS OF MAKING A SEMICONDUCTOR DEVICE USING MULTIPLE ANTIREFLECTIVE MATERIALS

(75) Inventors: Marie Angelopoulos, Cortlandt Manor, NY (US); Katherina E. Babich, Chappaqua, NY (US); Sean D. Burns, Hopewell Junction, NY (US); Richard A. Conti, Katonah, NY (US); Allen H. Gabor, Katonah, NY (US); Scott D. Halle, Hopewell Junction, NY (US); Arpan P. Mahorowala, Bronxville, NY (US); Dirk Pfeiffer, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 11/356,027

(22) Filed: Feb. 17, 2006

(65) Prior Publication Data
US 2007/0196748 A1    Aug. 23, 2007

(51) Int. Cl.
*H01L 21/4763* (2006.01)
(52) U.S. Cl. .......... 438/636; 438/72; 257/E21.029; 430/311
(58) Field of Classification Search .......... 438/72, 438/636, 952, 639; 257/E21.029; 430/311
See application file for complete search history.

(56) References Cited

U.S. PATENT DOCUMENTS

| | | | |
|---|---|---|---|
| 4,557,797 A | 12/1985 | Fuller et al. | |
| 6,218,078 B1 | 4/2001 | Iacoponi | |
| 6,268,457 B1 | 7/2001 | Kennedy et al. | |
| 6,410,209 B1 | 6/2002 | Adams et al. | |
| 6,420,088 B1 | 7/2002 | Angelopoulos et al. | |
| 6,503,689 B2 | 1/2003 | Zampini et al. | |
| 6,503,692 B2 | 1/2003 | Angelopoulos et al. | |
| 6,638,851 B2 | 10/2003 | Cowley et al. | |
| 6,653,048 B2 | 11/2003 | Brock et al. | |
| 6,660,645 B1 | 12/2003 | Bell et al. | |
| 6,686,124 B1 | 2/2004 | Angelopoulos et al. | |
| 6,730,454 B2 | 5/2004 | Pfeiffer et al. | |
| 7,326,646 B2 * | 2/2008 | Ruelke et al. | 438/636 |
| 2002/0052125 A1 | 5/2002 | Shafer et al. | |
| 2002/0195419 A1 | 12/2002 | Pavelcheck | |
| 2005/0274692 A1 | 12/2005 | Iwabuchi et al. | |
| 2005/0277058 A1 | 12/2005 | Hamada et al. | |
| 2005/0277755 A1 | 12/2005 | Iwabuchi et al. | |
| 2005/0277756 A1 | 12/2005 | Hamada et al. | |
| 2006/0177772 A1 * | 8/2006 | Abdallah et al. | 430/311 |
| 2008/0085458 A1 * | 4/2008 | Yamato et al. | 430/7 |

* cited by examiner

*Primary Examiner*—Phuc T Dang
(74) *Attorney, Agent, or Firm*—Connolly Bove Lodge & Hutz LLP; Daniel P. Morris

(57) ABSTRACT

A lithographic structure consisting essentially of: an organic antireflective material disposed on a substrate; a vapor-deposited RCHX material, wherein R is one or more elements selected from the group consisting of Si, Ge, B, Sn, Fe and Ti, and wherein X is not present or is one or more elements selected from the group consisting of O, N, S and F; and a photoresist material disposed on the RCHX material. The invention is also directed to methods of making the lithographic structure, and using the structure to pattern a substrate.

1 Claim, No Drawings

PROCESS OF MAKING A SEMICONDUCTOR DEVICE USING MULTIPLE ANTIREFLECTIVE MATERIALS

FIELD OF INVENTION

The present invention is directed to structures and methods useful for fabricating integrated circuits. In particular, the present invention is directed to a vapor deposited silicon, germanium, boron, tin, iron or titanium containing antireflective material in combination with an organic antireflective material for high resolution lithography.

BACKGROUND OF THE INVENTION

In the process of making semiconductor devices a photoresist and an antireflective material are applied to a substrate. Photoresists are photosensitive films used to transfer an image to a substrate. A photoresist is formed on a substrate and then exposed to a radiation source through a photomask (reticle). Exposure to the radiation provides a photochemical transformation of the photoresist, thus transferring the pattern of the photomask to the photoresist. The photoresist is then developed to provide a relief image that permits selective processing of the substrate.

Photoresists are typically used in the manufacture of semiconductors to create features such as vias, trenches or combination of the two, in a dielectric material. In such a process, the reflection of radiation during exposure of the photoresist can limit the resolution of the image patterned in the photoresist due to reflections from the material beneath the photoresist. Reflection of radiation from the substrate/photoresist interface can also produce variations in the radiation intensity during exposure, resulting in non-uniform linewidths. Reflections also result in unwanted scattering of radiation exposing regions of the photoresist not intended, which again results in linewidth variation. The amount of scattering and reflection will vary from one region of the substrate to another resulting in further non-uniform linewidths.

With recent trends towards high-density semiconductor devices, there is a movement in the industry to use low wavelength radiation sources into the deep ultraviolet (DUV) light (300 nm or less) for imaging a photoresist, e.g., KrF excimer laser light (248 nm), ArF excimer laser light (193 nm), electron beams and soft x-rays. However, the use of low wavelength radiation often results in increased reflections from the upper resist surface as well as the surface of the underlying substrate.

Substrate reflections at ultraviolet and deep ultraviolet wavelengths are notorious for producing standing wave effects and resist notching which severely limit critical dimension (CD) control. Notching results from substrate topography and non-uniform substrate reflectivity which causes local variations in exposure energy on the resist. Standing waves are thin film interference or periodic variations of light intensity through the resist thickness. These light variations are introduced because planarization of the resist presents a different thickness through the underlying topography. Thin film interference plays a dominant role in CD control of single material photoresist processes, causing large changes in the effective exposure dose due to a tiny change in the optical phase. Thin film interference effects are described in "Optimization of optical properties of resist processes" (T. Brunner, SPIE 10 Proceedings Vol. 1466, 1991, 297).

Bottom anti-reflective coatings (BARCs) have been used with single material resist systems to reduce thin film interference with some success. However, BARCs do not provide control of topographic variations and do not address the differences in resist thickness. BARCs such as silicon nitride or silicon oxynitride typically follow the already existing topography, and thus, the BARC exhibits nearly the same thickness non-uniformity as the underlying material. Consequently, the BARC alone will generally not planarize topographic variations resulting from underlying device features. As a result, there will be a variation in exposure energy over the resist. Current trends to provide uniform topography via chemical/mechanical polishing still leaves significant variations in film thickness.

Variations in substrate topography also limits resolution and can affect the uniformity of photoresist development because the impinging radiation scatters or reflects in uncontrollable directions. As substrate topography becomes more complex with more complex circuit designs, the effects of reflected radiation becomes even more critical. For example, metal interconnects used on many microelectronic substrates are particularly problematic due to their topography and regions of high reflectivity.

One approach to variations in substrate topography is described in U.S. Pat. No. 4,557,797 (Fuller et al.). Another approach used to address variations in substrate topography is described in Adams et al., *Planarizing AR for DUV Lithography, Microlithography* 1999: *Advances in Resist Technology and Processing XVI*, Proceedings of SPIE, vol. 3678, part 2, pp 849-856, 1999, which discloses the use of a planarizing antireflective coating.

Although multimaterial patterning schemes exist in the prior art (see, U.S. Pat. No. 6,140,226; and R. D. Goldblett, et.al. Proceedings of the IEEE 2000 International Technology Conference, p 261-263), there remains the need for new antireflective materials. Many of the prior antireflective materials contain silicon based intermediate materials that do not act as antireflective coatings, e.g. silicon oxide like materials require the use of an additional antireflective coating because they cannot be optically tuned to control reflections.

To obtain optimal lithographic performance, the use of a relatively thin photoresist is desired. A thin photoresist provides for enhanced resolution and greater depth of focus. A thin photoresist, however, does not provide the etch performance needed for the transfer of the resist pattern into the underlying substrate. Significant resist loss occurs while the BARC is being patterned, in addition to striations and surface roughening. This problem becomes more serious if a thin photoresist is used.

It is desirable to develop a thin resist process which provides excellent lithographic performance and provides appropriate etch resistance for effective pattern transfer into the underlying substrate. To accomplish this, new antireflective materials are needed which provide better etch selectivity to resist than current silicon-based or organic antireflective materials. The antireflective materials need to (1) have appropriate optical properties at appropriate wavelengths, (2) provide good etch selectivity to resist (greater than 1:1) and (3) exhibit little, if any, interaction with the resist to minimize residue, footing and undercut which limits the overall lithographic performance of the resist.

The present trend to 248 nm and 193 nm lithography and the demand for sub 200 nm features also requires that new processing schemes be developed. To accomplish this, tools with higher numerical aperture (NA) are emerging. The higher NA allows for improved resolution but reduces the depth of focus of aerial images projected onto the resist. Because of the reduced depth of focus, a thinner resist is typically required. However, as the thickness of the resist is decreased, the resist becomes less effective as a mask for subsequent dry etch image transfer to the underlying substrate. In many instances, if a substantial etching depth is required, or if it is desired to use certain etchants for a given underlying material, the resist thickness is now insufficient to complete the etch process. Without significant improvement in the etch resistance exhibited by current single material resists, these systems cannot provide the necessary etch characteristics for high resolution lithography.

SUMMARY OF THE INVENTION

A lithographic structure consisting essentially of: an organic antireflective material disposed on a substrate; a vapor-deposited RCHX material, wherein R is one or more elements selected from the group consisting of Si, Ge, B, Sn, Fe and Ti, and wherein X is not present or is one or more elements selected from the group consisting of O, N, S and F; and a photoresist material disposed on the RCHX material.

The invention is also directed to methods of making the lithographic structure, which can then be used to pattern a substrate. The method comprises: providing a substrate; depositing an organic antireflective material on the substrate; depositing a RCHX antireflective material on the organic antireflective material by vapor deposition, wherein R is one or more elements selected from the group consisting of Si, Ge, B, Sn, Fe and Ti, and wherein X is not present or is one or more elements selected from the group consisting of O, N, S and F; and depositing a photoresist on the RCHX antireflective material. The photoresist is then patterned exposed to radiation, and portions of the photoresist are removed to expose portions of the RCHX antireflective material. The exposed portions of the RCHX antireflective material are then removed to expose portions of the organic antireflective. The exposed portions of the organic antireflective material are then removed followed by portions of the substrate to provide a patterned substrate.

DETAILED DESCRIPTION OF THE INVENTION

To address many of the semiconductor processing issues summarized in the "Background of the Invention", applicants have developed a novel processing technique that includes a vapor-deposited, RCHX antireflective material in combination with an organic antireflective material. The use of two antireflective materials provides the engineer with the process control and flexibility required for high resolution (low wavelength) lithography. For example, the engineer can selectively etch the organic antireflective material relative to the RCHX antireflective material. As a result, once the RCHX antireflective material is patterned, the underlying organic antireflective material can be etched with minimal removal of the RCHX material.

Applicant's process addresses many of the above issues by initially transferring the resist pattern to the vapor-deposited RCHX antireflective material which then serves as an etch mask to continue transferring the pattern into a relatively thick organic antireflective material. These materials are characterized by: (1) appropriate optical properties at a given wavelength; (2) little, or no, adverse interaction with the resist, thus minimizing residue, a foot or undercut; (3) improved etch selectivity to resist, thus allowing a thinner resist to be used than that possible with conventional BARCs; and (4) excellent etch selectivity between the RCHX antireflective material and organic antireflective material.

The vapor deposited RCHX material can also function as a hardmask as it provides good etch selectivity for etch transfer into the organic antireflective material. Also, because of the improved etch selectivity to resist, it is now possible to use a resist with a thickness below 5000 Å, and in some instances, with a thickness below 3000 Å or even 2000 Å.

The invention also provides the process engineer with the optical tunability or flexibility to control the antireflective properties of the semiconductor device, if needed. Through the specific design and selection of the RCHX and organic antireflective materials a semiconductor processing structure with the desired optical characteristics for low wavelength imaging is possible. Proper design and selection of optical constants for the RCHX and organic antireflective materials can suppress the undesired reflectivity from the polarization nodes TE and TM (x and y polarization states) at high NA lithography.

The invention is directed to a lithographic structure consisting essentially of: an organic antireflective material disposed on a substrate; a vapor-deposited RCHX material, wherein R is one or more elements selected from the group consisting of Si, Ge, B, Sn, Fe and Ti, and wherein X is not present or is one or more elements selected from the group consisting of O, N, S and F; and a photoresist material disposed on the RCHX material.

The RCHX antireflective materials that are useful to practice the invention consist essentially of one or more elements R selected from Si, Ge, B, Sn, Fe or Ti, and optionally one or more elements X selected from O, N, S or F. Examples of optically tunable, vapor-deposited, RCHX antireflective materials are described in U.S. Pat. Nos. 6,316,167 and 6,514,667, assigned to International Business Machines Corporation, of which the entire disclosure is incorporated herein by reference.

A list of exemplary embodiments of the types of vapor-deposited RCHX antireflective materials that can be used in the invention, and the depositions conditions used to prepare such materials, are disclosed in U.S. Pat. No. 6,316,167. In particular, the RCHX materials described on column 8, line 57 to column 11, line 19, are particularly suited for applicant's lithographic structure.

The optical properties of the lithographic structure can be tuned by variations in the deposition process. By changing process parameters such as bias voltage, gas flow, pressure and deposition temperature, the optical constants of the RCHX materials can be tuned. Model computations based on algorithms that rely on Fresnel coefficients as found in standard textbooks such as Optics, by E. Hecht and A. Zajac, published in 1979 by Wiley, pages 312 and 313, can be used to estimate optical constants of the RCHX materials, and thus, determine the minimal reflectance at the RCHX and resist interface.

The optical constants of interest are the index of refraction (n) and the extinction coefficient (k). The optical constants of the RCHX materials are from about n=1.4 to n=2.6 and k=0.01 to k=0.78 at a wavelength of 248 nm, 193 nm and 157 nm, 126 nm and extreme ultraviolet radiation. More commonly, the extinction coefficient (k) will be between 0.15 and 0.6, and the index of refraction (n) will be between 1.5 to 2.3. The optical constants of exemplary RCHX antireflective materials are listed in column 10, lines 24-35 of U.S. Pat. No. 6,316,167.

The optical constants, index of refraction (n) and extinction coefficient (k), of the RCHX material can be tuned by altering deposition conditions, including temperature, bias, pressure and flow, or by adjusting the amount of oxygen, nitrogen, and/or flourine, that is, the amount of X, in the RCHX antireflective material. In addition, the selection of an organic antireflective material with the appropriate optical constants in combination with a selected RCHX antireflective material can provide a semiconductor structure with excellent antireflective properties at 193 nm radiation, in particular at high NA lithography.

In addition, the index of refraction (n) and extinction coefficient (k) can be optionally graded along the thickness of the material to match the optical properties of both the organic antireflective material and the photoresist. Extremely high reflectivity control can be engineered into the described lithographic structure, by continuously varying the deposition conditions, thereby creating a gradient in optical properties throughout the thickness of the film. When the optical constants of the top and bottom surfaces of the ARC perfectly match those of their adjacent layers, zero reflection at the resist and ARC interface can be achieved.

The RCHX antireflective materials can be formed by plasma enhanced chemical vapor deposition (PECVD). Depositions by PECVD are carried out using chemical precursors, e.g., methylsilanes such as trimethylsilane, tetramethylsilane, or tetra- or octamethyltetrasiloxane or mixtures of methylsilanes with precursors containing oxygen such as $O_2$, $CO_2$, CO or $N_2O$, precursors containing nitrogen such as $N_2$, $NH_3$, or precursors containing fluorine such as $C_6F_6$, or any mixture of such precursors.

In one embodiment, the PECVD process is performed in a parallel plate reactor with the substrate placed on one of the electrodes. In another embodiment, the substrate is placed on the powered electrode of a parallel plate PECVD reactor, thus acquiring a negative bias. In still another embodiment, a parallel plate PECVD reactor with the substrate positioned on the grounded electrode can be used. Conditions used would be similar to those described above, but at relatively high substrate temperatures, e.g., up to 200° C. to 450° C.

The organic antireflective material used in the semiconductor structure can be any polymer containing the elements of carbon, hydrogen, oxygen and nitrogen and mixtures thereof, that can be spin applied and crosslinked with a heat treatment. Typical organic polymer compositions suitable for this invention are being used in lithographic applications such as organic BARCs or as planarizing undermaterials in bimaterial or other multimaterial lithographic schemes. Examples of suitable organic polymer compositions are described in U.S. Pat. Nos. 6,503,689; 6,410,209; 6,686,124; and U.S. published application 20020058204A1, of which the entire disclosures of each U.S. patent and the U.S. patent application are incorporated herein by reference.

The selection of which organic antireflective polymer composition to use will depend on several characteristics such as solubility, optical properties, thermal properties, mechanical properties, etch selectivity, and film forming ability. The resulting organic antireflective material will be suitable for low-wavelength radiation. Like the RCHX materials described above, the organic polymer can have a plurality of different chemical groups each having a specific function in the overall performance of the material. Optical properties, mode of insolubilization, solubility enhancement, and etch resistance are among the properties that can be tailored by a judicious selection of the chemical groups.

Examples of suitable organic polymers that can be used include poly(4-hydroxystyrene), copolymers of 4-hydroxystyrene such as with up to 40 weight % of an alkyl methacrylate, alkylacrylate and/or styrene; novolac resins, acrylate polymers, methacrylate polymers, fluorocarbon polymers, and cycloaliphatic polymers such as norbornene-based and maleic anhydride polymers. Some examples of specific polymers include poly(3-hydroxystyrene), poly(acrylic acid), poly(norbornene carboxylic acid), copolymer of (4-hydroxystyrene and styrene), copolymer of 4-hydroxystyrene and acrylic acid, copolymer of styrene and acrylic acid, and copolymer of norbornene and maleic anhydride.

The organic antireflective material is a crosslinked polymer with little, if any, silicon. The organic antireflective material can be formed, for example, by spin coating followed by crosslinking. Organic antireflective materials and the processes by which they are made are well known to those in the art of semiconductor processing.

It is to be understood that the types of organic antireflective materials described in the paragraphs above are merely exemplary, and in some cases are preferred for use in the lithographic structures of the invention. For sure, other types of organic antireflective materials can be used in the lithographic structures.

The lithographic structures comprising the vapor-deposited RCHX and organic antireflective materials will likely exhibit excellent reflectivity control in particular at 193 nm lithography with a numerical aperture greater than 0.75 NA. Reflectivity control is accomplished by providing the appropriate optical properties for each of the RCHX and the organic antireflective materials. The CVD deposition conditions are optimized to achieve the appropriate index of refraction (both real and imaginary; n and k respectively) at 193 nm or 157 nm wavelengths.

In general, the organic antireflective material will have an index of refraction (n) of 1.3-2.0 and an extinction coefficient (k) of 0.4-0.9, at 193 nm radiation, and the RCHX antireflective material will have an index of refraction (n) of 1.5-2.3 and an extinction coefficient (k) of 0-0.6 at 193 nm radiation. Ideally, the antireflective materials provide a lithographic structure with a reflectivity below 0.5% up to NA=1.4, thus demonstrating excellent reflectivity control for a high NA lithography imaging process.

The optical constants and thickness used for the traditional antireflective material are n=1.8 and k=0.5 and a thickness of 30 nm. The optical constants and thickness used for the RCHX and organic antireflective materials are n=1.85, k=0.65, thickness=75 nm and n=1.82, k=0.2, and thickness of about 22 nm, respectively. As shown, the traditional material reflectivity at low NA is adequate if below 1%. In general, it is desired to have an antireflective material structure that results in reflectivity below 1% of the incident light. However, at high NA (a NA>1) the reflectivity increases sharply to values as high as 3-5%, which is typically considered unacceptable for a lithographic process. It is to be understood, however, that it is not necessary to have the exact optical constants and thickness values shown in this example in order to attain low reflectivity, and in fact these values will vary depending upon the underlying film stack.

Table 1 provides a range of optical properties and thickness that may result in low reflectivity control depending upon the underlying film stack.

TABLE 1

| structure material | thickness (nm) | n | k |
| --- | --- | --- | --- |
| photoresist | n/a | 1.6–2.3 | 0–0.05 |
| RCHX | 10–150 | 1.3–2.2 | 0–0.5 |
| organic | 20–500 | 1.3–2.2 | 0.2–1.0 |

The thickness of the vapor-deposited RCHX and organic antireflective materials depends upon the desired function. For most applications, the thickness of the RCHX antireflective material is typically about 10 nm to 60 nm. To achieve complete planarization the desired film thickness of the organic antireflective material is about 50 nm to 800 nm. Generally, the RCHX antireflective material will have a thickness of T and the organic antireflective material will have a thickness of about 4 T to about 12 T.

The RCHX and organic antireflective material structure is especially advantageous for lithographic processes used in the manufacture of integrated circuits on semiconductor substrates. The material structure is especially advantageous for lithographic processes using 193 nm, 157 nm, x-ray, e-beam or other imaging radiation. The composition is also especially useful for 193 nm high NA lithography with a numerical aperture (NA) ranging from 0.5-1.4.

The RCHX and organic antireflective material structure can be used in combination with any desired photoresist material in the formation of a lithographic semiconductor structure. Preferably, the photoresist can be imaged with low wavelength radiation or with electron beam radiation. Examples of suitable resist materials that can be used in the lithographic structures are described in U.S. Pat. No. 6,037,097, assigned to International Business Machines Corporation, the disclosure of which is incorporated herein by reference. As stated therein, these photoresists are particularly suited for UV and e-beam photolithography and comprise the following components: (1) an aqueous base soluble polymer or copolymer having polar functional groups, where some, but not all, of the polar functional groups are protected with a cyclic aliphatic ketal substituent having the formula RO—R'—; R'; is a substituted or unsubstituted cycloaliphatic group containing from 3 to 12 carbon atoms, and R is selected from the group consisting of a linear or branched alkyl containing from 1 to 12 carbon atoms, a cyclic alkyl containing from 3 to 12 carbon atoms and an aryl containing from 6 to 14 carbon atoms; (2) an acid generator; (3) a solvent for the base polymer or copolymer; (4) a base; and, optionally, (5) a surfactant.

It is to be understood that the photoresists described in U.S. Pat. No. 6,037,097 merely exemplary, and in many photolithographic applications cases are preferred for use in the lithographic structures of the invention. For sure, other types of photoresist materials also can be used in the lithographic structures including the chemically amplified resists described at column 1, lines 34-54 of U.S. Pat. No. 6,037,097.

The invention is also directed to a method of making a lithographic structure comprising:

providing a substrate;

depositing an organic antireflective material on the substrate;

depositing by vapor deposition a RCHX antireflective material on the organic antireflective material, wherein R is one or more elements selected from the group consisting of Si, Ge, B, Sn, Fe and Ti, and wherein X is not present or is one or more elements selected from the group consisting of O, N, S and F;

depositing a photoresist on the RCHX antireflective material, pattern expose the photoresist to radiation, and remove portions of the photoresist to expose the RCHX antireflective material, removing portions of the RCHX antireflective material to expose the organic antireflective material;

removing portions of the organic antireflective material to expose portions of the substrate; and removing portions of the substrate. Any remaining portions of the photoresist, the RCHX antireflective material, and the organic antireflective material are then removed to provide a patterned substrate.

The organic antireflective material structure is applied to a substrate, e.g., a dielectric or metal material, preferably by spin-coating. The deposited organic, polymer composition is then baked to remove solvent and cure (crosslink) the composition. The RCHX material is then vapor deposited on the organic antireflective material by CVD. A radiation-sensitive resist material is then applied over the cured RCHX antireflective material.

Typically, the solvent-containing resist composition is applied using spin coating or another technique. The photoresist coating is then typically heated (pre-exposure baked) to remove the solvent and improve the coherence of the photoresist material. The pre-exposure bake temperature may vary depending on the glass transition temperature of the photoresist. The thickness of the photoresist is preferably designed as thin as possible with the provisos that the thickness is substantially uniform and that the photoresist material be sufficient to withstand subsequent processing (typically reactive ion etching) to transfer the lithographic pattern.

After solvent removal, the resist material is then patternwise-exposed to the desired radiation (e.g. 193 nm ultraviolet radiation). Where scanning particle beams such as electron beam are used, patternwise exposure can be achieved by scanning the beam across the substrate and selectively applying the beam in the desired pattern. If ultraviolet radiation is used, the patternwise exposure is conducted through a mask which is placed over the resist material. For 193 nm UV radiation, the total exposure energy is about 100 millijoules/$cm^2$ or less, or about 50 millijoules/$cm^2$ or less (e.g. 15-30 millijoules/$cm^2$).

After the desired patternwise exposure, the resist material is typically baked to further complete the acid-catalyzed reaction and to enhance the contrast of the exposed pattern. The post-exposure bake is preferably conducted at about 60° C.-175° C., more preferably about 90° C.-160° C. The post-exposure bake is preferably conducted for about 30 seconds to 5 minutes. After post-exposure bake, the photoresist with the desired pattern is developed by contacting the resist material with an alkaline solution which selectively dissolves the areas of the resist which were exposed to the radiation. Preferred alkaline solutions (developers) are aqueous solutions of tetramethyl ammonium hydroxide. The resulting lithographic structure on the substrate is then typically dried to remove any remaining developer solvent.

In some cases it maybe desirable to remove the resist selectively to the RCHX containing material as part of a rework process in case of missprocessing of the resist during the lithographic process. The removal of the resist can be accomplished by dissolving the resist in an organic solvent, followed by baking to remove the solvent and the resist. Any solvent dissolving a photoresist is suitable. In some cases it is desirable to use solvents containing bases such as tetramethyl ammonium hydroxide or aqueous based solutions containing ammonium hydroxide. In some cases it is desirable to remove the RCHX antireflective material and the photoresist selectively to the organic antireflective material. In this case the solution for removal of the photoresist can contain fluorine. Alternatively, it is possible to etch the resist and/or the RCHX material by a dry strip using a plasma containing fluorine, carbon, hydrogen, chlorine, oxygen, bromine, nitrogen, sulfur and/or mixtures thereof. Of course, a combination of two described methods can also be used.

One advantage provided by the RCHX and organic antireflective material structure is that by optimizing the RIE condition using a reactive ion plasma comprising one or more of C, F, H, N, S and O, excellent selectivity between the RCHX and organic antireflective materials can ensure good pattern transfer. Once the organic antireflective material is patterned, the selective removal of the underlying substrate, e.g., a dielectric, can continue since there is sufficient organic material left for all subsequent etch steps.

In one embodiment, the proper pattern transfer based on the etch selectivity between photoresist, RCHX antireflective material and organic antireflective material is exemplified in FIG. 2. By using a fluorocarbon plasma, e.g., $CF_4/O_2$, a reactive ion etch (RIE) process, pattern transfer from the photoresist 10 into the RCHX antireflective material 12 is established without consuming much of the photoresist. The high etch selectivity in combination with choosing the appropriate thickness for the RCHX antireflective material enables the use of relatively thin photoresists. The pattern is then transferred into the underlying organic antireflective material 14. By using a non-fluorocarbon plasma based RIE process good selectivity between the RCHX antireflective material and organic antireflective material is established as well as consumption of the photo resist. Once the organic antireflective material is patterned, the pattern is then transferred to the substrate 16. If the substrate is a dielectric material such as an oxide or a low k silicon based dielectric, then a fluorocarbon based RIE process will likely ensure consumption of the RCHX antireflective material as well as good selectivity between the organic material and the dielectric. The remaining organic antireflective material is then removed by methods known to those in the art.

Another embodiment of the lithographic structure is to introduce a taper during the etch of the organic antireflective material, which effectively leads to reduction in bottom critical dimension compared to the bottom critical dimension after lithography of contact hole patterning. Introducing a taper during etch of contact holes using the lithographic structure provides an effective shrink method especially for contact hole pattern. Ion sputtering can be used to taper the corner edges of the organic antireflective material.

The lithographic structure can be used to create patterned material structures such as metal wiring lines, holes for contacts or vies, insulation sections (e.g., damascene trenches or shallow trench isolation), trenches for capacitor structures, etc, as might be used in the design of integrated circuit devices. The lithographic structure is especially useful in the context of creating patterned materials of substrates such as oxides, nitrides or polysilicon.

Examples of general lithographic processes where the lithographic structure can be useful are disclosed in U.S. Pat. Nos. 4,855,017; 5,362,663; 5,429,710; 5,552,801; 5,618,751; 5,744,376; 5,801,094; 5,821,469 and 5,948,570. Other examples of pattern transfer processes are described in Chapters 12 and 25 of "Semiconductor Lithography, Principles, Practices, and Materials" by Wayne Moreau, Plenum Press, (1988), the disclosure of which is incorporated herein by reference. It should be understood that the invention is not limited to any specific lithographic technique or device structure.

EXAMPLE 1

Silicon Antireflective Material Deposited by CVD

The organic polymer composition, SILKD-210, commercially available from Dow Chemical, was spin coated on an oxide wafer at 2000 rpm for 45 sec followed by a 310° C. hotplate bake for 120 sec. The film was cured in a furnace under nitrogen atmosphere for 1 hr at 400° C. The resulting organic antireflective material had a thickness of 280 nm and optical constants of n=1.55 and k=0.75 (193 nm). The SiCH and SiCHO compositions of Example 1A and 1B, respectively, were deposited on the organic antireflective material using a TEL PECVD tool. The silicon used and PECVD process conditions are provided below.

EXAMPLE 1A

A SiCH antireflective material (thickness of 30 nm) was prepared from trimethylsilane under the following process conditions:
flow rate of 350 sccm, helium dilution at a flow of 600 sccn
pressure in reactor is 5 torr
substrate temperature is 330° C.
Top RF power is 800 W; Bottom RF power is 30 W

| wavelength | n | k |
|---|---|---|
| 193 | 2.01 | 0.68 |
| 248 | 2.16 | 0.37 |

EXAMPLE 1B

A SiCHO antireflective material (thickness of 30 nm) was prepared from tetramethylcyclotetrasiloxane under the following process conditions:
flow rate of 150 sccm, helium dilution at a flow of 420 sccn
pressure in reactor is 1 torr
substrate temperature is 400° C.
Top RF power is 200 W; Bottom RF power is 0 W

| wavelength | n | k |
|---|---|---|
| 193 nm | 1.76 | 0.16 |
| 248 nm | 1.67 | 0.06 |

EXAMPLE 1C

A SiCHO film is deposited on SILKD 210 under the following conditions:

Trimethylsilane is introduced into the reactor at a flow of 150 sccm with helium as a carrier gas at flow of 1400 sccm mixed with $CO_2$ at flow of 700 sccm
pressure in reactor is 6.5 torr
substrate temperature is 290° C.
Top electrode power is 600 W
Bottom electrode power is 0 W
Target film thickness is about 220 Å

| wavelength | n | k |
|---|---|---|
| 193 nm | 2.0 | 0.26 |
| 248 nm | 1.72 | 0.03 |

EXAMPLE 1D

GeCHO film is deposited on SILKD 210 using tetramethylgermane at a flow of 50 sccm with helium as a carrier gas at flow of 250 sccm mixed with $CO_2$ at a flow of 100 sccm.
pressure in reactor is 2 Torr
substrate temperature is 235° C.
Top electrode power is 400 W Bottom electrode power is 15 W
Target film thickness is about 250 Å

| wavelength | n | k |
|---|---|---|
| 193 nm | 2.0 | 0.24 |
| 248 nm | 1.87 | 0.07 |

We claim:

1. A method of making a lithographic structure consisting of providing a substrate; depositing an organic antireflective material on the substrate; depositing a RCHX antireflective material on the organic antireflective material by vapor deposition wherein R is element B and X is element S, and depositing a photoresist on the RCHX antireflective material wherein the deposited RCHX antireflective material and the deposited organic antireflective material together provide a reflectivity below 0.5% up to numerical aperture (NA) of 1.4 at 193 nm and wherein the RCHX material is deposited from a precursor mixture further comprising carbon dioxide or carbon monoxide.

* * * * *